United States Patent
Tada et al.

(10) Patent No.: US 6,705,509 B2
(45) Date of Patent: Mar. 16, 2004

(54) METHOD OF RECOVERING LEAD-FREE SOLDER FROM PRINTED CIRCUIT BOARDS

(75) Inventors: Sakari Tada, Yokohama (JP); Eietsu Hasegawa, Satte (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 13 days.

(21) Appl. No.: 10/103,572

(22) Filed: Mar. 22, 2002

(65) Prior Publication Data

US 2003/0178470 A1 Sep. 25, 2003

(51) Int. Cl.$^7$ .......................... B23K 31/02; B23K 5/22; B23K 28/00; B23P 17/00
(52) U.S. Cl. .................. 228/119; 228/19; 228/20.1; 228/264; 29/403.4; 29/411; 29/426.4
(58) Field of Search ............... 228/119, 19, 26.1, 228/40, 264; 219/506, 445.1, 385, 386, 393; 29/426.1, 426.4, 402.03, 403.3, 403.4, 411

(56) References Cited

U.S. PATENT DOCUMENTS

| 5,552,579 A | * | 9/1996 | Krueger ..................... 219/411 |
| 5,743,936 A | * | 4/1998 | Yokoyama et al. ........... 75/403 |
| 6,467,671 B1 | * | 10/2002 | Unagami .................. 228/20.1 |
| 6,568,612 B1 | * | 5/2003 | Aoki et al. .................... 241/19 |

FOREIGN PATENT DOCUMENTS

| JP | 06260731 | | 9/1994 |
| JP | 07326834 | | 12/1995 |
| JP | 10-147819 A | * | 6/1998 |
| JP | 11026896 | | 1/1999 |
| JP | 11-34058 A | * | 2/1999 |
| JP | 11-150362 A | * | 6/1999 |
| JP | 2000-269614 A | * | 9/2000 |
| JP | 2001-77489 A | * | 3/2001 |

* cited by examiner

*Primary Examiner*—Lynne R. Edmondson
(74) *Attorney, Agent, or Firm*—Michael Tobias

(57) ABSTRACT

Discarded printed circuit boards are sorted according to the alloying elements in solder used on the printed circuit boards. After sorting, the printed circuit boards are heated to melt the solder, and the molten solder is collected.

10 Claims, 1 Drawing Sheet

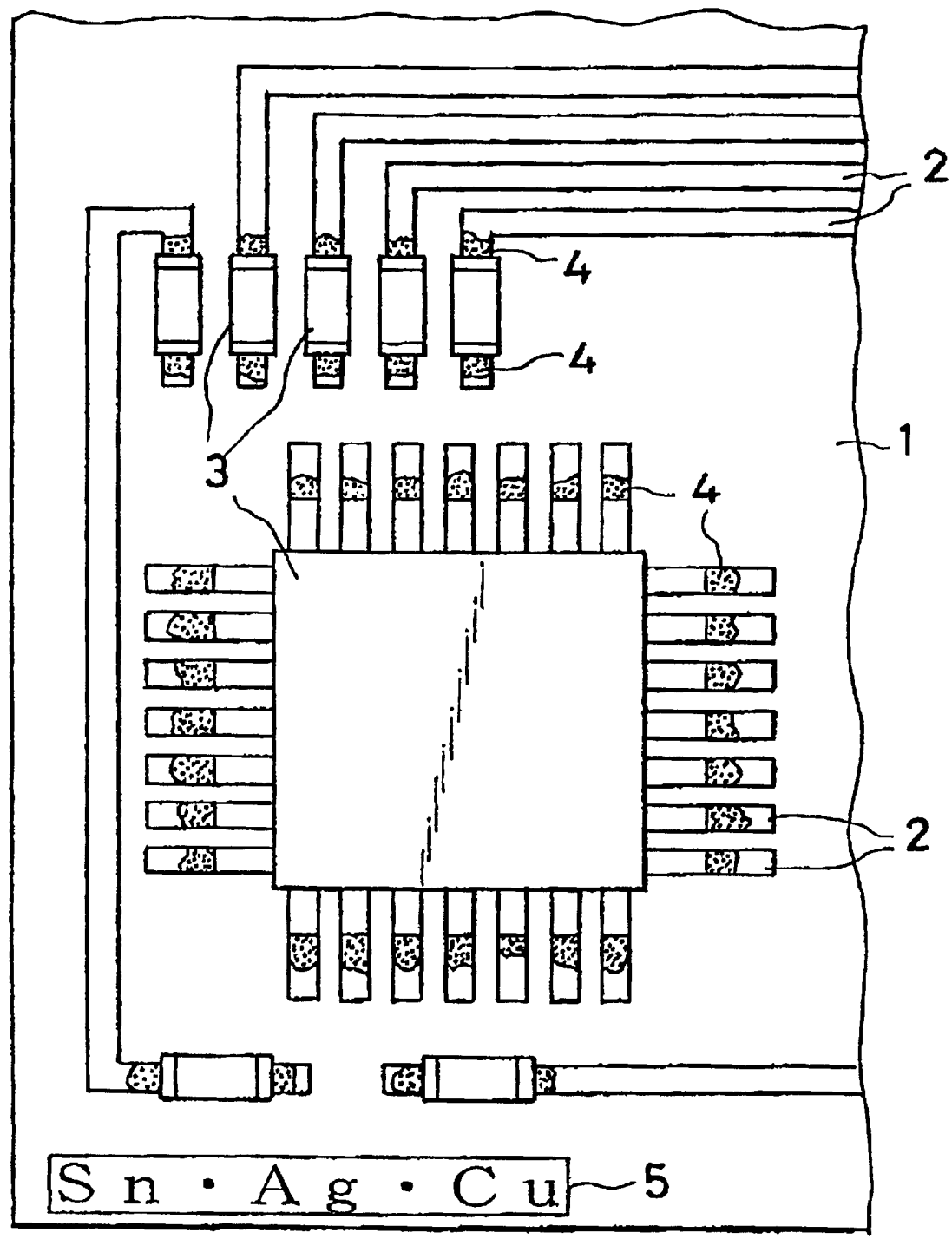

METHOD OF RECOVERING LEAD-FREE SOLDER FROM PRINTED CIRCUIT BOARDS

BACKGROUND OF THE INVENTION

1. Field of the Invention

This invention relates to a method of recovering lead-free solder used in printed circuit boards employed in electronic equipment such as televisions, videos, and computers.

2. Description of the Related Art

A printed circuit board for use in electronic equipment typically comprises a polymeric substrate having a circuit formed on a surface thereof with copper foil, silver paste, or other materials. Electronic components are usually mounted on mounting portions of the circuit with solder.

Traditionally, solders for use in printed circuit boards have been lead-based solders containing a large proportion of lead. However, in recent years, due to increased awareness of the potentially harmful effects on the environment of lead-based solders, lead-free solders which do not contain lead have come to be widely used for all types of electronic equipment.

The most common lead-free solders are tin-based solders, in which Sn is combined with one or more additional alloying elements such as Ag, In, Sb, or Bi. The alloying elements employed in lead-free solders tend to be expensive. Since electronic equipment containing printed circuit boards employing lead-free solders is discarded in enormous quantities, the solder in the printed circuit boards represents a huge potential source of valuable metals. However, an economically practical method of recovering lead-free solders from discarded printed circuit boards has yet to be developed, so at present, printed circuit boards in discarded electronic equipment are usually disposed of without the lead-free solder thereon being recovered, so the economic potential of the lead-free solder is not being realized.

SUMMARY OF THE INVENTION

The present invention provides a method of efficiently and economically recovering lead-free solder from printed circuit boards.

In one form of the present invention, discarded printed circuit boards are sorted according to the alloying elements contained in the lead-free solder used therein. The solder is recovered from the sorted printed circuit boards by heating the printed circuit boards to melt the solder and separate the molten solder from the printed circuit board. The molten solder is then collected. Because the printed circuit boards have been sorted prior to melting the solder, different types of solder can be prevented from mixing with each other, so the solder can be economically refined to permit its reuse.

After recovery of the solder, the printed circuit board may be discarded, recycled, or otherwise processed.

Preferably each printed circuit board to be sorted is provided with an indicator indicating the alloying elements in the solder used in the manufacture of the printed circuit board, and the printed circuit boards are sorted based on the information in the indicators.

BRIEF DESCRIPTION OF THE DRAWINGS

The sole FIGURE is a plan view of a portion of a printed circuit board having an indication of the type of solder used therein.

DESCRIPTION OF PREFERRED EMBODIMENTS

The method according to the present invention can be performed with any type of printed circuit board employing a lead-free solder and is not limited to ones of any particular size, shape, or function. Printed circuit boards currently use a wide variety of lead-free solder compositions, and there is no restriction on the composition of the solder in circuit boards to be treated by the method of the present invention.

Solder can be effectively recovered from a printed circuit board by heating the printed circuit board to at least the melting point of the solder, letting the molten solder flow off the printed circuit board, and collecting the molten solder in a container, such as one placed beneath the printed circuit board. When the solder is molten, it will usually flow off the printed circuit board due to gravity without the need to impart any force. However, it is also possible to apply a force to either the printed circuit board or the molten solder by vibrating, spinning, brushing, blowing, sucking, or other manner to aid in the separation of the molten solder from the printed circuit board. A printed circuit board will typically have electronic components secured to it by the solder which is to be recovered. In some cases, it is desirable to remove the components from the printed circuit board, such as when the components contain valuable materials capable of being recovered or when the components are capable of being reused. In this case, the components may be removed from the printed circuit board either before or after the solder is melted and collected.

Surface mounted electronic components such as chip components on a discarded printed circuit board are generally not reused. Such electronic components are capable of floating atop molten solder without melting. Therefore, when recovering lead-free solder from a printed circuit board having surface mounted electronic components, it may be convenient to simultaneously remove the solder and the electronic components from the printed circuit board and then to subsequently separate the solder and the electronic components from each other. For example, the printed circuit board with surface mounted electronic components still attached to it can be heated to at least the melting point of the solder, and then the molten solder and the electronic components can together be physically dislodged from the printed circuit board by a method such as contacting the heated printed circuit board with a rotating brush a suitable number of times (such as 2 or more times) or blowing a high pressure, high temperature gas at the heated printed circuit board. The molten solder and the electronic components which are removed from the printed circuit board in this manner can be collected in a container placed below the printed circuit board. The electronic components, which float atop the molten solder in the container, can be easily skimmed off or otherwise separated from the molten solder.

A printed circuit board may be easier to handle if it is still in one piece (i.e., in the same form as it had when installed in electronic equipment) when heating is performed to melt the solder on the printed circuit board.

Since a single printed circuit board may have only a small amount of solder on it, the solder collected from a plurality of printed circuit boards may be combined before being subjected to further treatment, such as refining. A single printed circuit board will usually contain only a single type of solder, but many types of lead-free solders exist, and different printed circuit boards will frequently have been soldered with different types of solder When collecting solder which has been melted off printed circuit boards in the method of the present invention, there is generally no drawback to mixing two solders containing the same alloying element in different proportions (such as an Sn-2.5Ag solder and an Sn-3Ag solder), since the proportions of alloying elements in the combined solders can be subsequently adjusted by adding an additional amount of one or more of the alloying elements. However, it is preferable not to mix solders containing different alloying elements (such as an Sn—Ag solder and an Sn—Bi solder), since it is troublesome to remove an unwanted alloying element from a solder alloy.

Therefore, the printed circuit boards to be processed according to the method of the present invention are preferably sorted according to the chemical composition of the solders used their prior to melting to prevent solders containing different alloying elements from being mixed with each other. In order to facilitate sorting, the printed circuit boards preferably include an indicator (typically provided at the time of the manufacture of the printed circuit boards) indicating the alloying elements contained in the solder used on the printed circuit board. If desired, the indicator may also indicate additional information, such as the proportions of the alloying elements in the solder or the melting point of the solder.

There is no restriction on the form of the information provided in the indicator. To give a few examples, it can be in the form of the chemical symbols of the alloying elements in the solder (such as Sn, Ag, Zn, Sb, In, etc), it can be in the form of the names of the alloying elements in the solder (such as tin, silver, zinc, antimony, indium, etc.), it can be in the form of predetermined colors, each corresponding to a specific alloying element (such as yellow for tin, green for silver, red for bismuth, etc.), or it can be in the form of numbers, symbols, geometric shapes, or bars of varying width (as in a bar code).

There are also no restrictions on the physical structure of the indicator itself. The indicator may be in a form capable of being directly read by a human with the unaided eye, or it may be in a form designed to be read only with the aid of a machine. For example, the indicator may be in the form of a label, a marking made directly on the surface of the printed circuit board by silk screening or etching, a magnetic strip, or an IC memory. Examples of some of the many types of indicators which can be employed in the present invention are described in Japanese Published Unexamined Patent Application No. 2000-269614.

The indicator is preferably provided on a portion of a printed circuit board where it does not interfere with circuits or electronic components mounted on the printed circuit board and where it is easy to access for reading the information indicated by the indicator.

The sole FIGURE is a plan view illustrating a portion of an example of a printed circuit board equipped with an indicator. The printed circuit board 1 has circuits 2 of copper foil formed on its upper surface. Electronic components 3 are mounted on mounting portions of the circuits 2 and electrically connected to the mounting portions with a lead-free solder 4, which in the present example is a ternary Sn—Ag—Cu composition. An indicator 5 which indicates the alloying elements forming the solder is in the form of a label containing the symbols Sn, Ag, and Cu for the alloying elements. The indicator 5 is attached to the top surface of the printed circuit board 1 near its periphery. The indicator 5 can be easily read to enable a human operator to sort the printed circuit board 1 according to the alloying elements in the solder and to group with the printed circuit board 1 with other printed circuit boards containing the same alloying elements.

After the solder has been recovered from the printed circuit board, the remaining portions of the printed circuit board may be discarded reused, or recycled in a conventional manner, depending upon the materials making up the printed circuit board.

The solder which is recovered from a plurality of printed circuit boards by the method of the present invention is of high purity, since it contains only the same combinations of alloying elements as used in the printed circuit boards being processed. Therefore, it can be economically refined to obtain high quality lead-free solder capable of being used in a wide variety of soldering applications.

What is claimed is:

1. A method of recovering lead-free solder from printed circuit boards comprising sorting a plurality of printed circuit boards according to the alloying elements contained in lead-free solder used on the printed circuit boards, heating the sorted printed circuit boards to melt the solder, separating the molten solder from the printed circuit boards, and collecting the molten solder.

2. A method as claimed in claim 1 comprising sorting the printed circuit boards based on indicators on the printed circuit boards indicating the alloying elements contained in the solder used on the printed circuit boards.

3. A method as claimed in claim 1 including removing electronic components from the printed circuit boards before melting the solder.

4. A method as claimed in claim 1 wherein each printed circuit board is in one piece when heated to melt the solder.

5. A method as claimed in claim 1 wherein separating the molten solder comprises allowing the molten solder to flow off the printed circuit boards.

6. A method as claimed in claim 2 including sorting the printed circuit boards based on visual indicators on the printed circuit boards indicating the proportions of the alloying elements contained in the solder used on the printed circuit boards.

7. A method as claimed in claim 2 including sorting the printed circuit boards based on visual indicators on the printed circuit boards indicating the melting point of the solder used on the printed circuit boards.

8. A method as claimed in claim 2 including sorting the printed circuit boards based on visual indicators on the printed circuit boards having different color for each of the alloying elements contained in the solder used on the printed circuit boards.

9. A method as claimed in claim 1 including sorting the printed circuit boards such that solders containing the same alloying elements in different proportions are mixed with each other in the molten solder but such that solders containing different alloying elements are not mixed with each other.

10. A method as claimed in claim 2 wherein each printed circuit board is in one piece when heated to melt the solder.

* * * * *